(12) United States Patent
Quah

(10) Patent No.: US 7,098,051 B2
(45) Date of Patent: Aug. 29, 2006

(54) STRUCTURE AND METHOD OF DIRECT CHIP ATTACH

(75) Inventor: Guan Keng Quah, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 220 days.

(21) Appl. No.: 10/852,898

(22) Filed: May 25, 2004

(65) Prior Publication Data

US 2004/0219718 A1 Nov. 4, 2004

Related U.S. Application Data

(62) Division of application No. 10/237,123, filed on Sep. 9, 2002, now Pat. No. 6,787,392.

(51) Int. Cl.
*G01R 31/26* (2006.01)
*H01L 21/66* (2006.01)

(52) U.S. Cl. ......... 438/15; 257/E21.526; 257/E21.521

(58) Field of Classification Search ............ None
See application file for complete search history.

(56) References Cited

U.S. PATENT DOCUMENTS 6,555,401 B1 * 4/2003 Koduri ............... 438/18
6,680,213 B1 * 1/2004 Farnworth et al. ........ 438/15
6,976,616 B1 * 12/2005 Mano et al. ............ 228/49.5
2005/0064697 A1 * 3/2005 Ference et al. .......... 438/615

* cited by examiner

*Primary Examiner*—David A. Zarneke
(74) *Attorney, Agent, or Firm*—Kevin B. Jackson

(57) ABSTRACT

A semiconductor package (101) has a die (1), a leadframe (4), a bond pad (6), an encapsulation (3) and a wire bond ball (2). The wire bond ball is formed on the bond pad by bonding one end of a bond wire (7), and remainder of the bond wire is removed. Locations (23) for attaching the wire bond ball are recorded with reference to fiducials (5) on the lead frame. The encapsulation covers the die, deposits and die attach flag (24) of the lead frame. The wire bond ball is exposed where the encapsulation is removed. The locations for making openings (17) for exposing the wire bond ball is determined by recorded coordinates when the wire bond ball is formed. Exposed wire bond ball is plated, forming a lead to electrically connect to the die.

21 Claims, 6 Drawing Sheets

STRUCTURE AND METHOD OF DIRECT CHIP ATTACH

The present application is based on prior U.S. application Ser. No. 10/237123 filed on Sep. 9, 2002, now U.S. Pat. No. 6,787,392 which is hereby incorporated by reference, and priority thereto for common subject matter is hereby claimed.

BACKGROUND OF THE INVENTION

The present invention relates in general to semiconductor devices and, more particularly, to low profile packaged semiconductor devices.

In semiconductor device manufacture, semiconductor dice are mounted within sealed packages. A non-conductive encapsulation surrounds the die providing protection from damage and contaminates. In addition, the package provides a lead system for connecting circuitry fabricated on the die to external circuitry, such as a printed circuit board.

A typical die has a back surface with one electrode or no circuitry, and a top surface having a component or integrated circuitry fabricated thereon. The component is electrically accessible via bond pads located on the outer portion of the top surface, which may be arranged in a wide variety of patterns both near the edge of the die and at the center of the die.

Often, the initial step in the packaging process is attaching a lead frame, made of metal sheet-stock, to the back surface of the die. A wire is ball bonded at one end to a bond pad, and the other end of the wire is stitch bonded to a lead of the lead frame providing electrical connection to external circuitry.

Packaging has advanced beyond using only a lead frame for connecting the integrated circuitry on the die to external circuitry. Packaging called direct chip attach (DCA) has a lead frame that has a lead that contacts one surface of the die and uses conductive solder bumps formed directly on the opposite die surface as other leads.

One of the disadvantages associated with DCA is the additional manufacturing steps needed to form an under barrier metal structure on the die metallization to prevent solder from contaminating the die.

External connections to the die and lead frame of DCA packages typically are made with solder bumps. Where a DCA device requires a connection to the die's back surface, the leadframe is bent so that the lead frame bumps are formed in nearly in same plane as the die bumps in order to ensure that all leads uniformly contact a system circuit board. However, previous DCA devices suffer from as low yield due to misalignment of the die to the lead frame, which results in the lead frame bumps and die bumps being misaligned with respect to each other. Even if a die is placed perfectly on the leadframe, misalignment may occur when a die attach material such as solder is reflowed because the die can "float" out of alignment with the leadframe. The misalignment reduces the process yield and increases the cost of the DCA devices.

Hence, there is a need in the industry for a semiconductor device and method of improving yield in a DCA package in order to reduce the fabrication cost of the device.

DETAILED DESCRIPTION OF THE DRAWINGS

In the figures, elements having the same reference number have similar functionality.

Figure 1A:
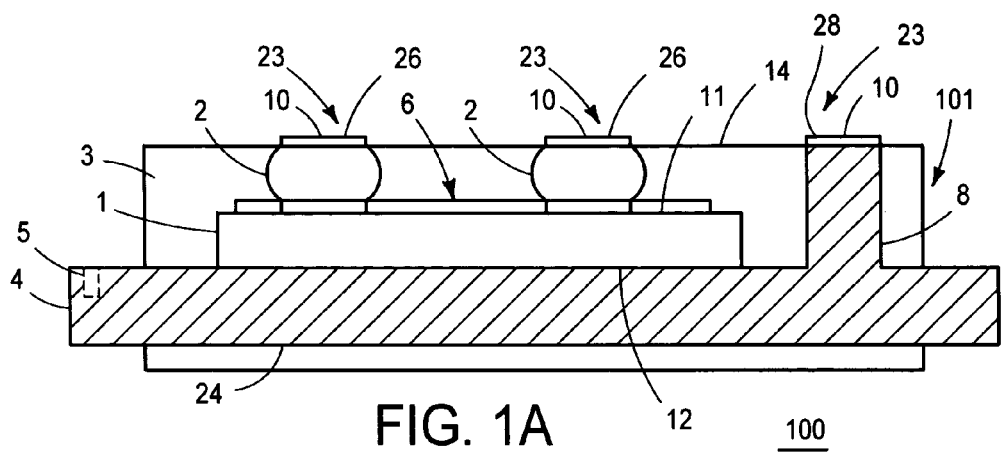
FIG. 1A is a cross-sectional view of a semiconductor device.

FIG. 1A is a cross-sectional view of a semiconductor device 100 including a semiconductor package 101 and a semiconductor die 1. Semiconductor device 100 includes a plurality of deposits 2 formed on semiconductor die 1 that function as leads for making external electrical connections to semiconductor device 100. In one embodiment, deposits 2 comprise wire bond balls as described in detail below. Semiconductor package 101 includes a leadframe 4, one or more flags 8 and an encapsulation 3.

Semiconductor die 1 has a top surface 11 for forming a bond pad 6 that operates as a source electrode coupled to a source lead 26 of semiconductor device 100, and a bottom surface 12 that is mounted on leadframe 4, which consequently operates as a drain electrode which is coupled through flag 8 to a drain lead 28 that is coplanar with source lead 26. In one embodiment, semiconductor die 1 comprises a power field-effect transistor providing a drain current greater than about 0.5 amperes.

Encapsulation 3 comprises an epoxy resin or other standard molding compound used for protecting semiconductor die 1 from damage or contamination. Note that encapsulation 3 does not cover a portion of leadframe 4 in order to view fiducials 5 during fabrication. In addition, portions of deposits 2 and flags 8 are exposed in order to route electrical signals between semiconductor die 1 and external circuitry.

Leadframe 4 is formed with a main body 24 and nearly perpendicular flags 8 for electrically and mechanically supporting drain lead 28. A portion of lead frame 4 extends from encapsulation 3 and includes fiducials 5 that are used as reference points for aligning to leadframe 4. In an embodiment where deposits 2 are wire bond balls placed with a wire bond tool, the locations 23 where deposits 2 are to be placed are determined in advance by the package specifications and are stored in the memory of the wire bond tool.

After mounting die 1 on leadframe 4, deposits 2 are formed at locations 23 using fiducials 5 as a reference. Hence, deposits 2 are aligned to leadframe 4 rather than semiconductor die 1. Deposits 2 extend upwardly from surface 11 to function as source lead 26 of semiconductor device 100 and from flag 8 to function as drain lead 28.

In one embodiment, deposits 2 are formed with wire bond balls made of gold or copper bonding wire using a standard wire bonding tool (not shown). In one embodiment, deposits 2 are formed using solder balls reflowed for electrical and mechanical attachment to bond pads 6. Deposits 2 typically have a height in a range between about seventy-five micrometers to about one thousand five hundred above surface 11.

Deposits 2 and flags 8 are covered with a conductive material referred to as a plating 10 to facilitate soldering semiconductor package 100 to a motherboard. In one embodiment, plating 10 includes a tin-lead solder combination, nickel or similar conductive materials. Plating 10 includes any barrier metal, such as nickel, under the exposed plating surface. Encapsulation 3 is formed to have a surface 14 and, deposits 2 are planarized to have surfaces coplanar with surface 14 as described below. Since deposits 2 and surface 14 are coplanar, plating 10 is formed so as to project from surface 14 to facilitate soldering to a motherboard.

The small height of deposits 2 combined with the total thickness of semiconductor die 1 and leadframe 4 provide a semiconductor device 100 with lower overall height than previous devices while maintaining a low fabrication cost.

Figure 1B:
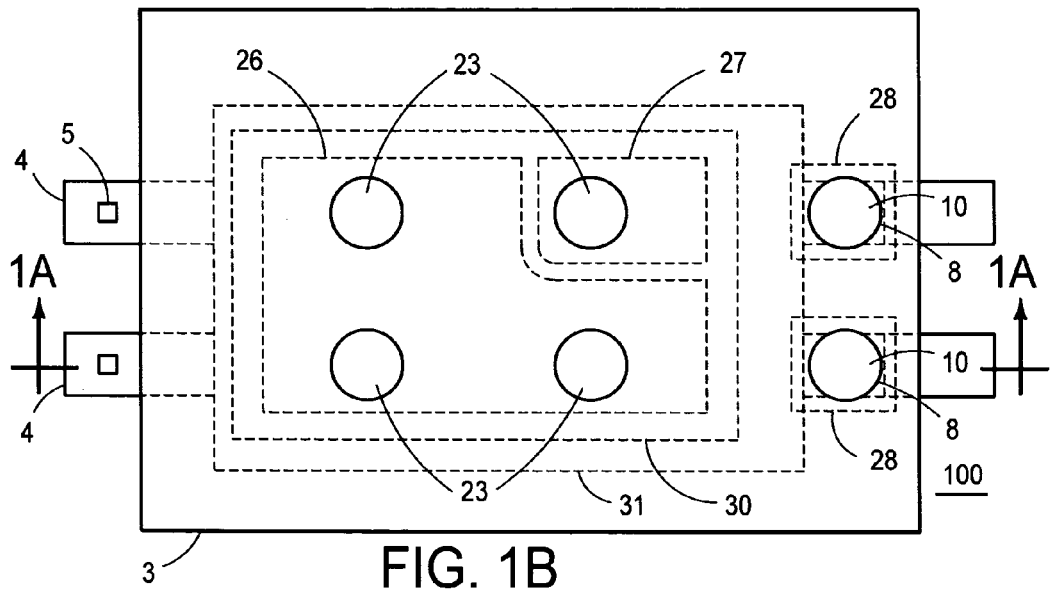
FIG. 1B is a top view of the semiconductor device.

FIG. 1B illustrates a top view of semiconductor device 100 showing semiconductor die 1 in an ideal alignment to lead frame 4 with an edge 30 of semiconductor die 1 essentially parallel to a corresponding edge 31 of lead frame 4. A gate lead 27 and source lead 26 are formed with deposits 2 on a standard patterned semiconductor metallization film as shown. Drain lead 28 is back-side connected to die 1 through flags 8.

Figure 1C:
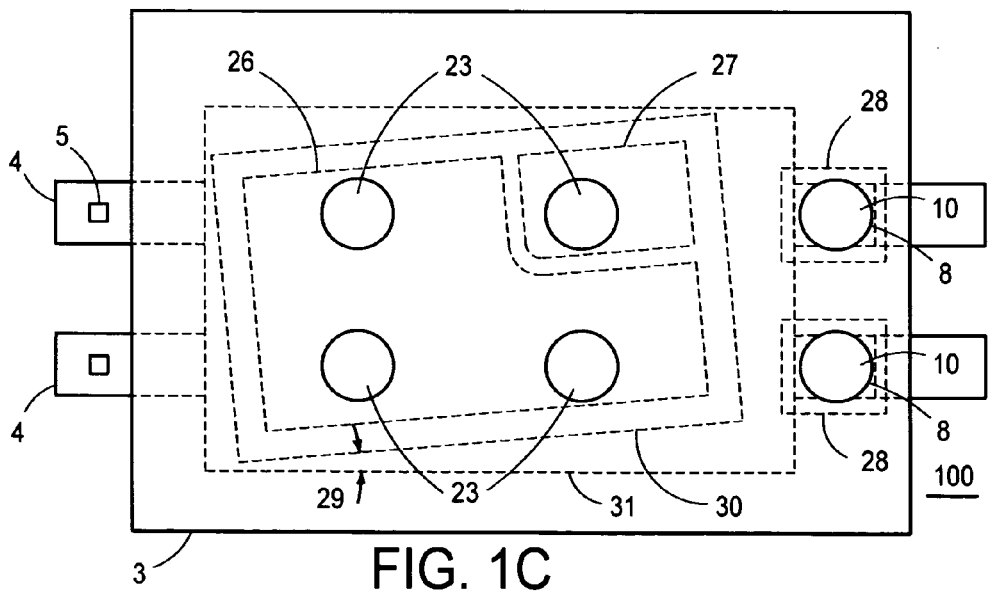
FIG. 1C is a top view of semiconductor device in an alternate embodiment.

FIG. 1C shows a top view of semiconductor device 100 with die 1 in a non-ideal alignment so that edge 30 of semiconductor die 1 is rotated to form a nonzero angle 29 with edge 31 of leadframe 4 as shown. Such rotation or misalignment results from variability of the assembly manufacturing process. Note that because deposits 2 are placed in reference to fiducials 5, locations 23 for source and gate leads 26 and 27, respectively, are the same positions in relation to fiducials 5 as they are under the ideal alignment conditions of FIG. 1B. Similarly, locations 23 for source and gate leads 26 and 27, respectively, are the same in relation to drain lead 28 as they are under the ideal alignment conditions of FIG. 1B. The amount of die rotation, i.e., the size of angle 29, can be as much as five degrees or more.

Figure 2:
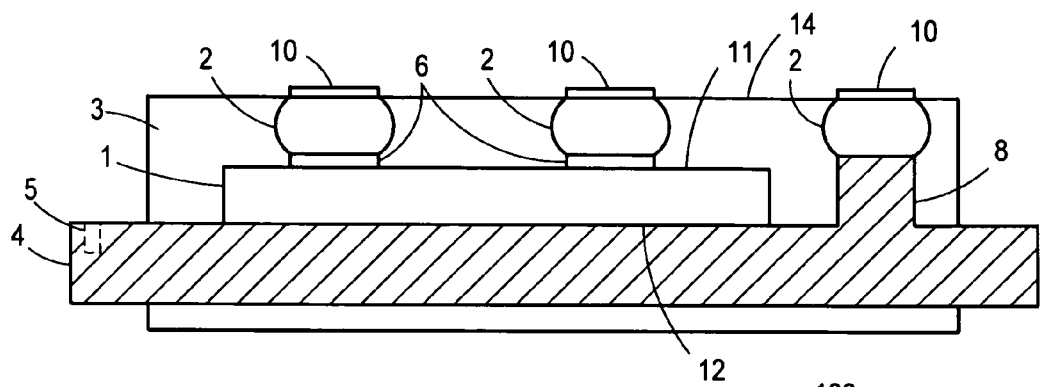
FIG. 2 is a cross-sectional view of the semiconductor device in a second alternate embodiment.

FIG. 2 shows a cross-sectional view of semiconductor device 100 in an alternate embodiment. The functions and structures of elements are similar to those described previously except that deposits 2 are formed at the top of each flag 8, thereby providing deposit 2 between flag 8 and external circuitry. The deposit 2 formed on the flag 8 is used where there is a need for the same structures for plating 10.

Figure 3:
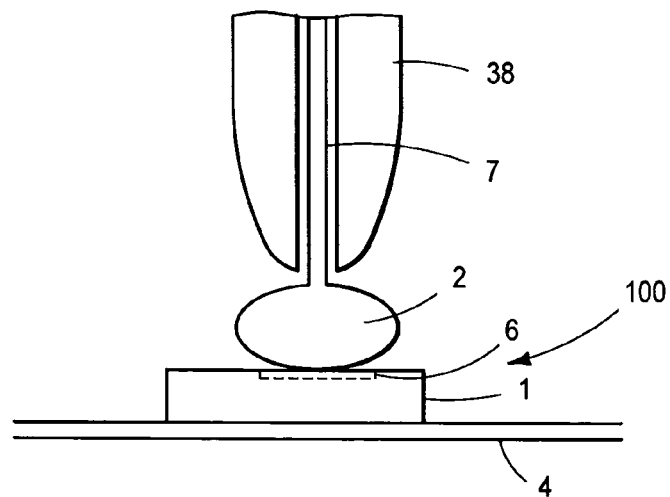
FIG. 3 is a side-view of the semiconductor device after a selected processing stage.

FIG. 3 shows semiconductor device 100 after a selected processing stage after die 1 is attached to lead frame 4. A capillary 38 of a wire-bonding tool dispenses a bonding wire 7 onto bond pad 6 of die 1. Wire 7 is melted to form a generally spherical shape and then attached to bond pad 6 as deposit 2. The remaining portion of wire 7 is then removed leaving only deposit 2 on bond pad 6. Hence, deposit 2 of this embodiment is a standard wire bond without any projecting wire.

Figure 4:
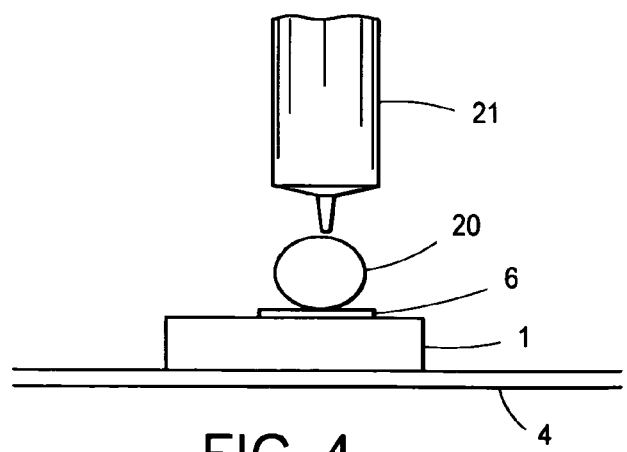
FIG. 4 is a side-view of the semiconductor device in a third alternate embodiment after a defined processing stage.

FIG. 4 shows the processing of semiconductor device 100 in an alternate embodiment. Deposit 2 is formed with conductive epoxy or other conductive material that is dispensed using a dispenser 21 onto bond pads 6. The formation of deposit 2 on bond pad 6 provides a low cost approach for providing electrical connection to external circuitry.

Note that semiconductor device 100 uses a package 101 that has no bonding wire and associated loop. As a result, semiconductor device 100 provides a low profile while using standard processing tools and avoiding the need for complex processing steps. The current carrying cross-sectional area of deposit 2 is larger than the area of bonding wire 7, which was used to form deposit 2. The larger cross-sectional area of deposit 2 provides a lower resistance for semiconductor device 100 and therefore increases current carrying capability. In addition, a larger cross-sectional area improves the thermal conductivity and heat transfer from semiconductor die 1.

Figure 5:
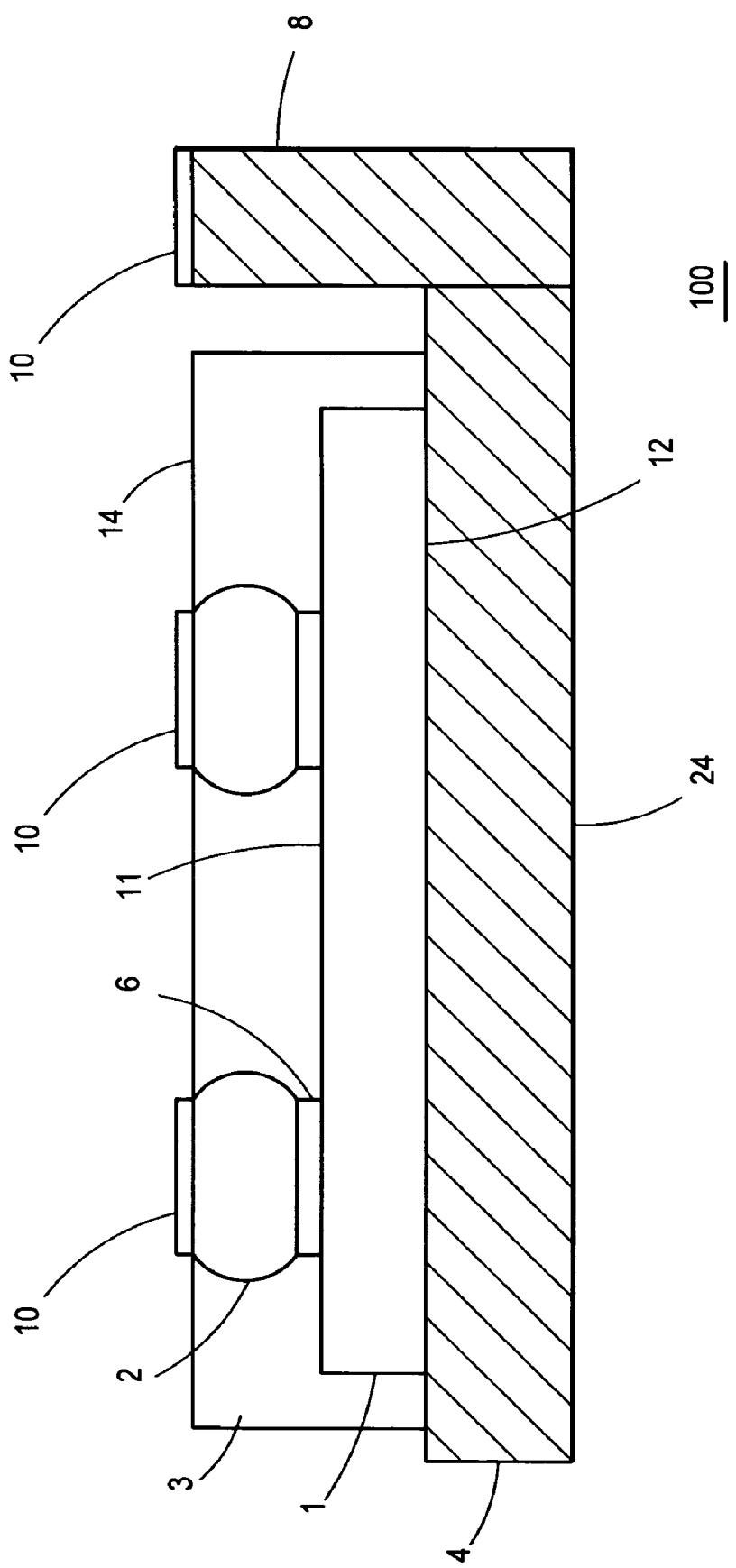
FIG. 5 is a cross-sectional view of the semiconductor device in a fourth alternate embodiment.

FIG. 5 shows a cross-sectional view of semiconductor device 100 in yet another alternate embodiment. Encapsulation 3 is formed so as to leave uncovered flags 8 and a die attach flag 24 of lead frame 4. By exposing die attach flag 24 and flags 8, heat generated by semiconductor die 1 is allowed to escape more efficiently, which improves heat transfer and the power dissipation capability of semiconductor package 101.

Figure 6:
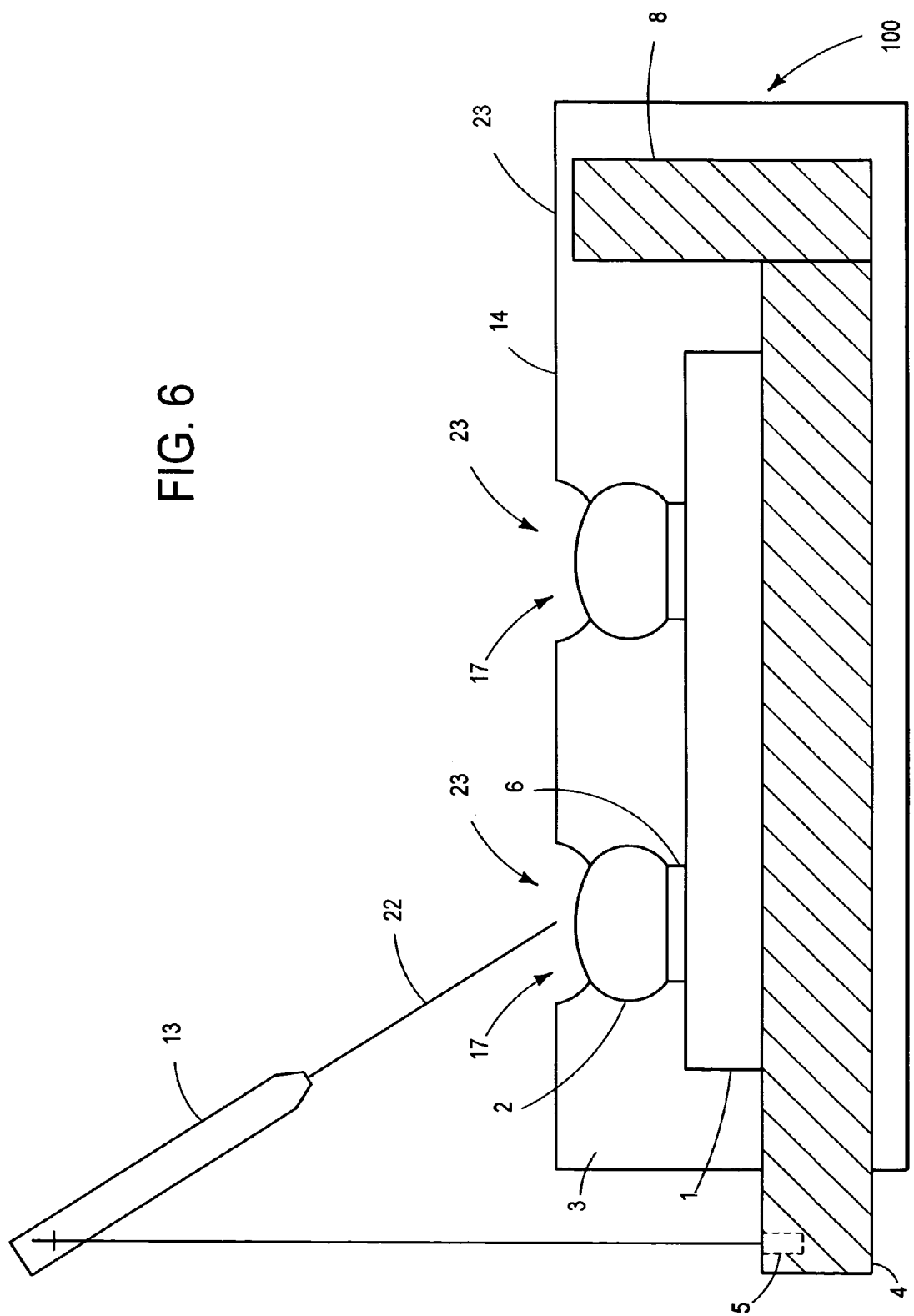
FIG. 6 is a cross-sectional view of the semiconductor device showing a selected processing step using a laser.

FIG. 6 is a cross-sectional view of still another alternate embodiment of semiconductor device 100 during a selected processing step using a laser 13. In this embodiment, encapsulation 3 is formed so that deposits 2 and plating 10 are recessed from surface 14 and therefore hidden from view.

Recall that locations 23 are associated with deposits 2 and were previously recorded and stored. Laser 13 is programmed to use fiducials 5 as a reference for directing its beam 22 toward locations 23 to remove material from encapsulation 3 to form openings 17 on surface 14. Since openings 17 overlay deposits 2, the energy provided by beam 22 ablates portions of encapsulation 3 to expose deposits 2 and flags 8. Also recall, the disadvantage of DCA devices due to misalignment of bumps between the carrier and the die. The placement and exposure of deposits 2 with recorded and stored locations 23 prevents any misalignment.

In an alternate method of forming leads 26–28, deposits 2 are formed while semiconductor die is still in a wafer form by placing large solder balls, copper balls or other conductive material in desired locations on top surface 11. The solder balls are made larger than the size of locations 23 taking into account the worst case misalignment between die 1 and lead frame 4. After semiconductor device 100 is encapsulated, portions of deposits 2 under encapsulation 3 are exposed via stored locations 23. As a result, when locations 23 are ablated using a laser or similar tool, the exposed portions of deposits 2 operate as leads 26–28. Hence, with this method, the final step in forming leads 26–28 is the opening of locations 23 at sites referenced to fiducial 5, i.e., referenced to a point on lead frame 4.

Deposits 2 typically are coated with solder balls (not shown) but remain recessed within openings 17. The recession facilitates the alignment of the solder balls for mounting to a circuit board.

Figure 7:
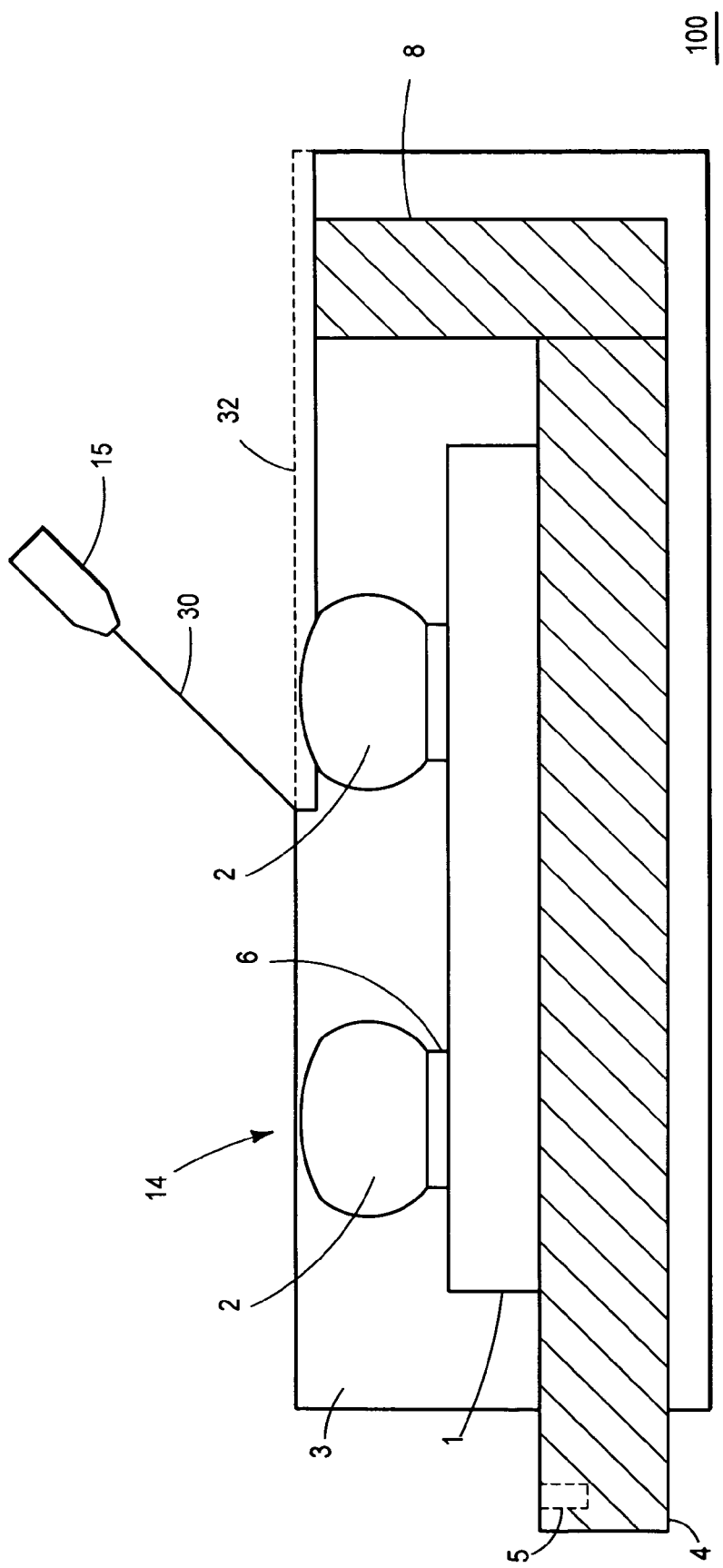
FIG. 7 is a cross-sectional view of the semiconductor device showing a processing step using a water jet.

FIG. 7 is a cross-sectional view of semiconductor device 100 showing a water jet 15 removing material from encapsulation 3. Water jet 15 sprays a water stream 30 on encapsulation 3 to remove material uniformly from surface 14 to lower surface 14 to a height indicated by a dashed line 32 that exposes deposits 2. Alternatively, grinding or lapping may be used to remove the material from surface 14 to expose the deposit 2.

Figure 8:
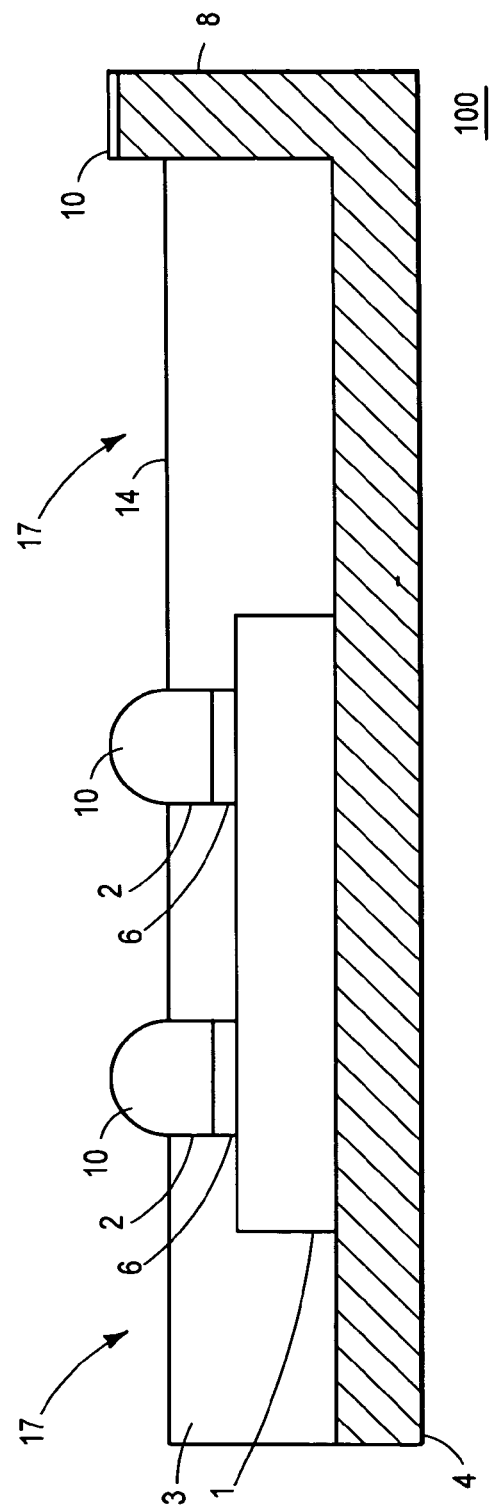
FIG. 8 shows a cross-sectional view of the semiconductor device in a fifth alternate embodiment.

FIG. 8 is a cross-sectional view of semiconductor device 100 after material has been uniformly removed from encapsulation 3 so that portions of both deposits 2 and flags 8 protrude above surface 14. With removal of encapsulation 3 below a portion of both deposits 2 and flags 3, DCA mounting to a system circuit board is facilitated.

In summary, the present invention provides a semiconductor device 100 that uses standard equipment to achieve a low fabrication cost while providing a low package height. A semiconductor device has a semiconductor die mounted on a leadframe with a deposit formed with a wire bond ball that is attached to a bonding pad of the die to form a lead. The deposit is formed in a location on the die that is referenced to a point on the lead frame such as a fiducial. This method aligns deposits on the die to maintain a fixed lead pattern even where the die is slightly rotated due to manufacturing variability.

What is claimed is:

1. A method of making a semiconductor device, comprising the steps of:
    attaching a semiconductor die to a lead frame; and
    forming a wire bond ball on the semiconductor die at a location referenced to a point on the lead frame to produce a lead of the semiconductor device.

2. The method of claim 1, wherein the step of forming further comprising the steps of:
    bonding a wire to a bonding pad on the semiconductor device; and
    removing the wire to form the wire bond ball.

3. The method claim 1, wherein the step of forming includes the step of aligning the wire bond ball to a fiducial on the lead frame.

4. The method of claim 1, further comprising the steps of:
    enclosing the semiconductor die and the leadframe with an encapsulation; and
    removing material from the encapsulation to expose the wire bond ball.

5. The method of claim 4, wherein the step of removing includes the step of selectively ablating the material at the location.

6. The method of claim 5, wherein the step of selectively ablating includes the step of ablating the material with a laser beam.

7. The method of claim 4, wherein the step of removing material includes the step of spraying the encapsulation with a water stream.

8. The method of claim 1, further comprising the step of coating the wire bond ball with solder or nickel.

9. A method of making a semiconductor device, comprising the step of forming a first deposit on a surface of a semiconductor die at a location aligned to a lead frame to produce a first lead of the semiconductor device.

10. The method of claim 9, further comprising the step of forming a second deposit on a flag of the lead frame to produce a second lead of the semiconductor device.

11. The method of claim 9, wherein the step of forming includes the step of bonding a wire bond ball at the location.

12. The method of claim 11, further comprising the steps of:
    enclosing the semiconductor die with an encapsulation; and
    removing material from the encapsulation at the location to expose the wire bond ball.

13. A method for forming a direct chip attach device comprising the steps of:
    providing a support substrate having a main body and an alignment portion;
    attaching a semiconductor die to the main body;
    forming conductive deposits on a major surface of the semiconductor die using the alignment portion as a reference whereby the conductive deposits are aligned to the support substrate;
    forming an encapsulating layer over the semiconductor die, the conductive deposits, and a portion of the support substrate; and
    removing portions of the encapsulating layer to expose portions of the conductive deposits using the alignment portion as a reference.

14. The method of claim 13 wherein the removing step includes ablating portions of the encapsulating layer with a laser.

15. The method of claim 13 wherein the removing step includes removing with a water jet.

16. The method of claim 13 wherein the removing step includes mechanically removing portions of the encapsulating layer.

17. The method of claim 16 wherein the removing step includes lapping portions of the encapsulating layer.

18. The method of claim 16 wherein the removing step includes grinding portions of the encapsulating layer.

19. The method of claim 13 wherein the step of removing includes forming recessed openings over the conductive deposits.

20. The method of claim 19 further including the step of attaching a solder ball to one of the conductive deposits through the recessed opening.

21. The method of claim 13 further including the step of removing another portion of the encapsulating layer to expose a surface of the support substrate.

* * * * *